United States Patent [19]
Funahashi et al.

[11] Patent Number: 5,610,555
[45] Date of Patent: Mar. 11, 1997

[54] LOW-VOLTAGE DRIVEN, AUDIO SIGNAL AMPLIFYING APPARATUS AND A PORTABLE ACOUSTIC SYSTEM USING SAID APPARATUS

[75] Inventors: Hiroyuki Funahashi; Isao Yamamoto, both of Ukyo-ku, Japan

[73] Assignee: Rohm Co., Ltd., Kyoto, Japan

[21] Appl. No.: 518,388

[22] Filed: Aug. 15, 1995

[30] Foreign Application Priority Data

Aug. 18, 1994 [JP] Japan .................................. 6-216643

[51] Int. Cl.$^6$ ................................ H03F 1/34; H03F 3/68
[52] U.S. Cl. ......................... 330/84; 330/107; 330/110; 330/124 R; 330/294; 330/295; 381/28; 381/98; 381/121
[58] Field of Search .............................. 330/84, 110, 107, 330/124 R, 294, 295; 381/27, 28, 98, 101, 121

[56] References Cited

U.S. PATENT DOCUMENTS 4,363,001 12/1982 Suzuki et al. ...................... 381/101 X

FOREIGN PATENT DOCUMENTS 4323908 11/1992 Japan ...................................... 330/84

*Primary Examiner*—James B. Mullins
*Attorney, Agent, or Firm*—Fay, Sharpe, Beall, Fagan, Minnich & McKee

[57] ABSTRACT

The apparatus includes output stage amplifiers for receiving the respective outputs of preamplifiers provided in correspondence to the left and right channels in a stereo system. Negative feedback circuits are provided in the respective output stage amplifiers for reducing the amount of low-band negative feedback. Switch circuits are turned on in response to feedback signals from the respective negative feedback circuits for supplying the feedback signals at the input to the output stage amplifiers.

8 Claims, 3 Drawing Sheets

LOW-VOLTAGE DRIVEN, AUDIO SIGNAL AMPLIFYING APPARATUS AND A PORTABLE ACOUSTIC SYSTEM USING SAID APPARATUS

DESCRIPTION

1. Technical Field

This invention relates to a low-voltage driven, audio signal amplifying apparatus and a portable acoustic system using said apparatus. More specifically, the invention relates to audio output amplifiers for use in portable magnetic tape players and CD players which can be driven on one or two dry cells and audio equipment that features good channel separation, low noise and high sound quality and can be implemented using said audio output amplifiers.

2. Technical Art

Conventional headphone stereo systems, portable magnetic tape players such as DCC and DAT, and portable disk players such as MD and CD are driven on one or two dry cells. This means the supply voltage of the portable circuits is only about 1.2 or 2.4 volts. In addition, most audio circuits have a stereophonic capability and the circuit of the output stage consists of two channels.

Many users of such portable acoustic systems want long play to be realized with only one dry cell being used as the drive source. Recent audio models of circuits are furnished with low-band booster amplifiers to achieve emphasis of the low-band frequency characteristic (which is hereunder referred to simply as "low-band").

FIG. 3 shows an example of the audio amplifier circuit 20 which is the essential part of a stereo audio system of the type contemplated by the invention which can be driven on one dry cell. The output circuit 10 is comprised of the left output amplifier (L channel amp) 11 and the right output amplifier (R channel amp) 12, and a voltage-follower center amplifier 13 which creates a virtually grounded state for generating a reference voltage which is about one half of Vcc. Both output amplifiers 11 and 12 are composed of an operational amplifier (OP) for reproducing sound in the left and right channels. The output of the center amplifier 13 is connected to the outputs of the amplifiers 11 and 12 via speakers 23 and 24, respectively.

L channel amp 11 receives an output signal from a lowband mixing amplifier 15 via a volume control 14. The mixing amplifier 15 is composed of a differential amplifier. Similarly, R channel amp 12 receives an output signal from a low-band mixing amplifier 17 via a volume control 16. The mixing amplifier 17 is also composed of a differential amplifier.

Low-band mixing amplifier 15 (or 17) is supplied at the (+) input with an audio signal as reproduced by L channel preamp 18 (or 19) and it is also supplied at the (−) input with a low-band output from a bus booster amplifier 21 via a buffer amplifier 15a (or 17a).

Bus booster amplifier 21 receives a L+R signal, which is the sum of the L and R channel signals from preamps 18 and 19, via a low-pass filter 22 composed of a resistor (R) and a capacitor (C), and the low-band component L+R is delivered as amplified by the bus booster amplifier 21. Thus, the low-band amplification factor of the mixing amplifiers 15 and 17 is increased with the output from the bus booster amplifier 21.

$C_1$, $C_2$, $C_3$ and $C_4$ are coupling capacitors, and 23 and 24 refer to the left and right headphone speakers which are connected to the amplifiers 11 and 12, respectively, in the output stage 10. The dry cell as the power source is omitted from FIG. 3.

Compared to component stereo systems and other types of audio equipment that are not subject to any particular limitations as regards the circuit scale and supply voltage, portable acoustic systems which are subject to various limitations and driven on low voltage will inevitably sacrifice sound quality. This problem has so far been tolerated as a compromise which is inherent in audio equipment of the type contemplated by the invention. However, models have recently been developed that feature not only multiple capabilities but also better sound quality.

In the light of this situation, the audio amplifier circuit 20 shown in FIG. 3 is unsatisfactory because the bus booster amplifier receives the L+R signal and amplifies its low-band component so as to increase the low-band amplification factor. First of all, the channel separation is deteriorated during bus boosting; second, amplification of the low-band component of the L+R signal by means of the specially provided booster amplifier causes additional noise. These and other problems with circuit design make it difficult to meet the demand for reproducing high sound quality using low-voltage drive as compared to ordinary, less exacting audio equipment.

SUMMARY OF THE INVENTION

The problems described above could be avoided by providing separate low-band mixing amplifiers in the left and right channels. However, this adds to power consumption and circuit scale, which certainly are not desirable for portable audio systems of the type contemplated by the invention. Furthermore, the inserted left and right mixing amplifiers increase the pathlength of the amplifier circuit from the input to the output end, resulting in increased noise.

An object, therefore, of the invention is to provide a low-voltage driven, audio signal amplifying apparatus that features an amplifier circuit of a shorter pathlength and smaller noise and which is yet capable of low-band emphasis without sacrificing the separation between the left and right channels.

Another object of the invention is to provide a portable acoustic apparatus that consumes small power on low-voltage drive and which is yet capable of low-band emphasis without sacrificing the separation between the left and right channels.

These objects of the invention can be attained by a low-voltage driven, audio signal amplifying apparatus and an acoustic system that each comprise:

output stage amplifiers for receiving the respective outputs of preamplifiers provided in correspondence to the left and right channels in a stereo system;

negative feedback circuits provided in the respective output stage amplifiers for reducing the amount of low-band negative feedback; and switch circuits which are turned on in response to feedback signals from the respective negative feedback circuits for supplying said feedback signals at the input to said output stage amplifiers; wherein said switch circuits are turned on simultaneously, thereby allowing said output stage amplifiers to perform low-band emphasis.

Thus, the invention effects low-band emphasis with the negative feedback circuits being provided in the output stage amplifiers in correspondence to the left and right channels for increasing the low-band amplification factor and this insures that the outputs of the preamplifiers in the left and right channels can be received directly by the independent left and right output stage amplifiers. As a result, there will be no deterioration in the channel separation during low-band emphasis. In addition, one only need provide the negative feedback circuits and the switch circuits to realize the invention and the resulting apparatus can be driven with a comparably low voltage as compared to the conventional version.

The apparatus of the invention has neither low-band mixing amplifiers nor a bus booster amplifier and, hence, not only the pathlength of the amplifier circuit from the input to the output end but also the overall circuit scale can be sufficiently reduced to cut noise and power consumption.

DESCRIPTION OF THE PREFERRED EMBODIMENT

Figure 1:
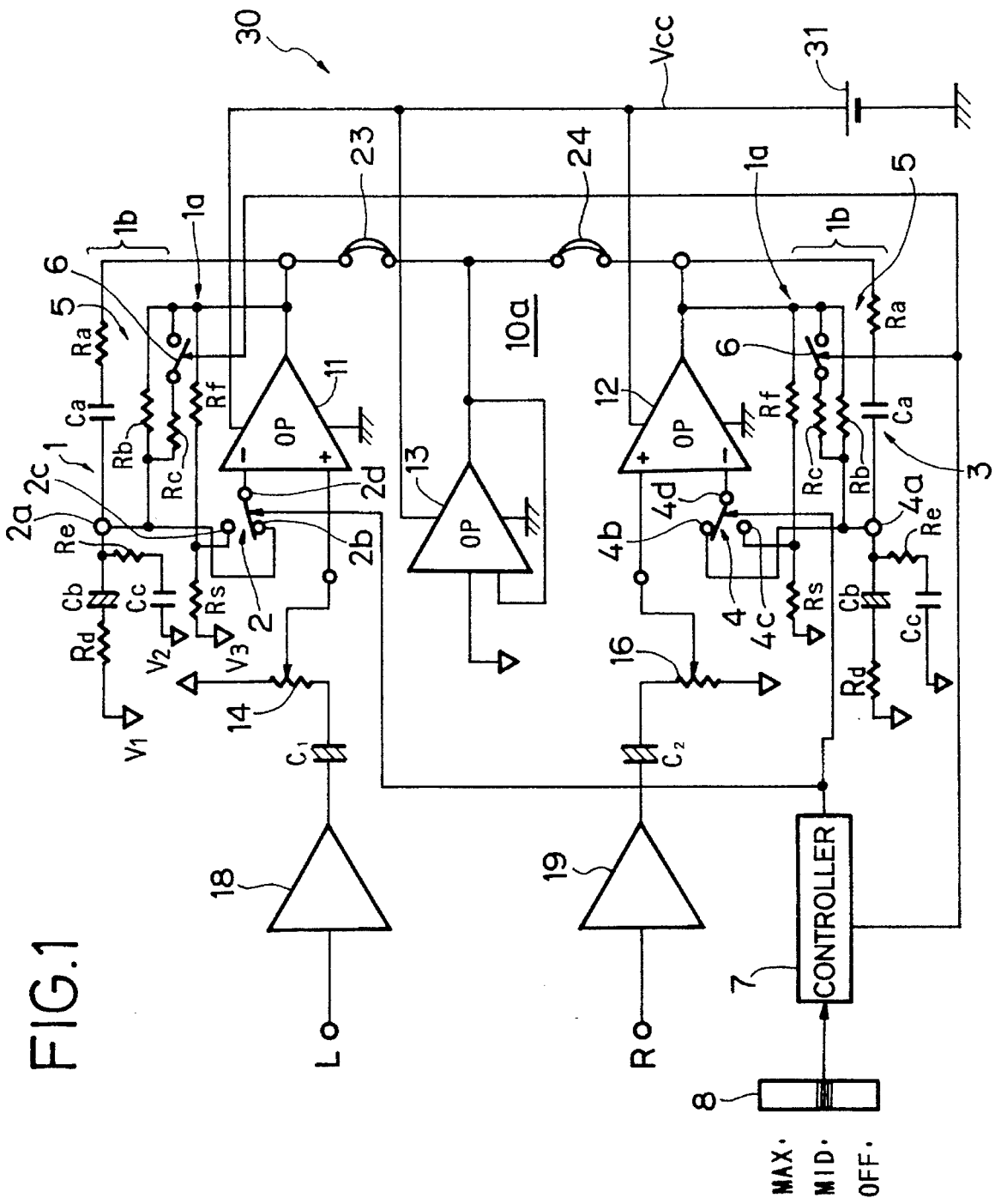
FIG. 1 is a block diagram showing the audio output circuit of a battery-driven portable acoustic system according to an embodiment of the present invention as it relates to a low-voltage driven, audio signal amplifying apparatus.
Figure 3:
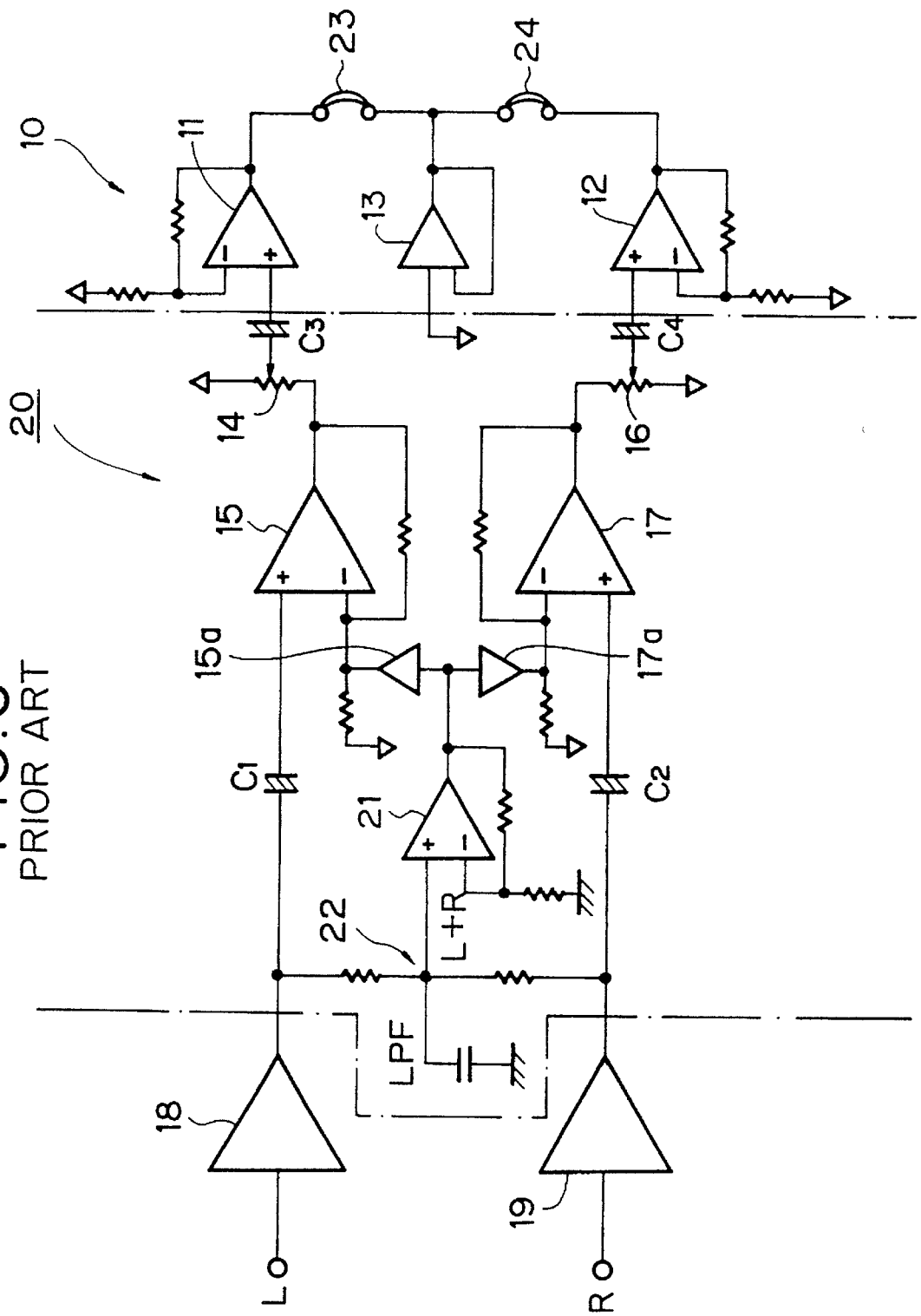
FIG. 3 is a block diagram showing the audio output circuit of a prior art battery-driven acoustic system.

Referring to FIG. 1, numeral 30 represents the audio output circuit of a portable acoustic system. Output amplifiers 11 and 12 in an output circuit 10a have a supply line Vcc connected to a single dry cell 31. Power switches and other components inserted between cell 31 and supply line Vcc are omitted from FIG. 1. The circuit shown in FIG. 1 does not include the low-band mixing amplifiers 15 and 17 and the bus booster amplifier 21 which are shown in FIG. 3. The output signals of preamplifiers 18 and 19 are sent to the (+) inputs of output amplifiers 11 and 12 in the output circuit 10a via volume controls 14 and 16, respectively. Instead of the low-band mixing amplifier 15 and the bus booster amplifier 21, a negative feedback circuit 1 and a switch circuit 2 are provided in the L channel output amplifier 11. Similarly, instead of the low-band mixing amplifier 17 and the bus booster amplifier 21, a negative feedback circuit 3 and a switch circuit 4 are provided in the R channel output amplifier 12. Center amplifier 13 is identical to what is shown in FIG. 3.

In the embodiment shown in FIG. 1, the negative feedback circuit 1 and the switch circuit 2 for the L channel are identical in configuration to the negative feedback circuit 3 and the switch circuit 4 for the R channel. Hence, the following description will center on the negative feedback circuit 1 and the switch circuit 2 for the L channel and the related description of the R channel circuits will be omitted by using like numerals and symbols to represent identical elements, except that terminals 2a, 2b, 2c and 2d of the L-channel switch circuit 2 correspond to 4a, 4b, 4c and 4d, respectively, of the R-channel switch circuit 4.

The negative feedback circuit 1 consists of two portions 1a and 1b; the first portion 1a has a flat frequency characteristic due to resistors and the second portion 1b has a bandpass filter that performs emphasis on the low- and high-band signals as they are fed back in reduced amounts. Switch circuit 2 is a two-input-one-output selection circuit which selects either the first negative feedback circuit portion 1a or the second portion 1b such that the selected portion is connected to the (−) input, or the reference side, of the output amplifier 11.

First negative feedback circuit portion 1a is comprised of a feedback resistor Rf which returns the output to the input and a reference resistor Rs which is inserted between the input (terminal 2c of switch circuit 2) and reference voltage line $V_3$. When a feedback signal is supplied to terminal 2c, the signal from the output undergoes negative feedback to the input, thereby determining the amplification factor of the output amplifier 11 in the flat frequency characteristic. Second negative feedback circuit portion 1b is comprised of a negative feedback circuit 5 having a filter circuit and a damping resistor Rc which is inserted parallel to the negative feedback circuit 5 via switch 6.

The negative feedback circuit 5 consists of a series circuit of resistor Ra and capacitor Ca, a medium- to high-pass filter circuit composed of resistor Rb connected parallel to said series circuit, a series circuit forming a low-pass filter that is composed of electrolytic capacitor Cb and resistor Rd which are provided between feedback signal generating terminal 2a (i.e., an external terminal connected direct to terminal 2b of switch circuit 2) and bias line $V_1$, and a series circuit forming a high-pass filter that is composed of capacitor Cc and resistor Re which are provided parallel to said low-pass filter forming series circuit and connected between terminal 2a and bias line $V_2$.

Switch circuit 2 has an input terminal 2b connected to terminal 2a at which the second negative feedback circuit portion 1b generates a feedback signal; input terminal 2c receives a feedback signal from the first negative feedback circuit portion 1a; output terminal 2d is connected to the (−) input of output amplifier 11. Because of this circuit configuration, the feedback signal applied to either one of the two input terminals 2b and 2c is delivered as output to terminal 2c.

The thus configured switch circuit 2 and the switch 6 are both turned on and off in response to a control signal from controller 7. The switch circuit 4 and the switch 6 for the R channel which correspond the switch circuit 2 and the switch 6, respectively, are also turned on and off in response to a control signal from the controller 7.

In response to the positions selected by an externally provided sliding manual switch 8, the controller 7 generates ON/OFF control signals to the switches 6, as well as the switch circuits 2 and 4. It should be noted here that the switch circuits 2 and 4 are operatively associated such that they are simultaneously turned on or off and this is also true with the two switches 6.

Figure 2:
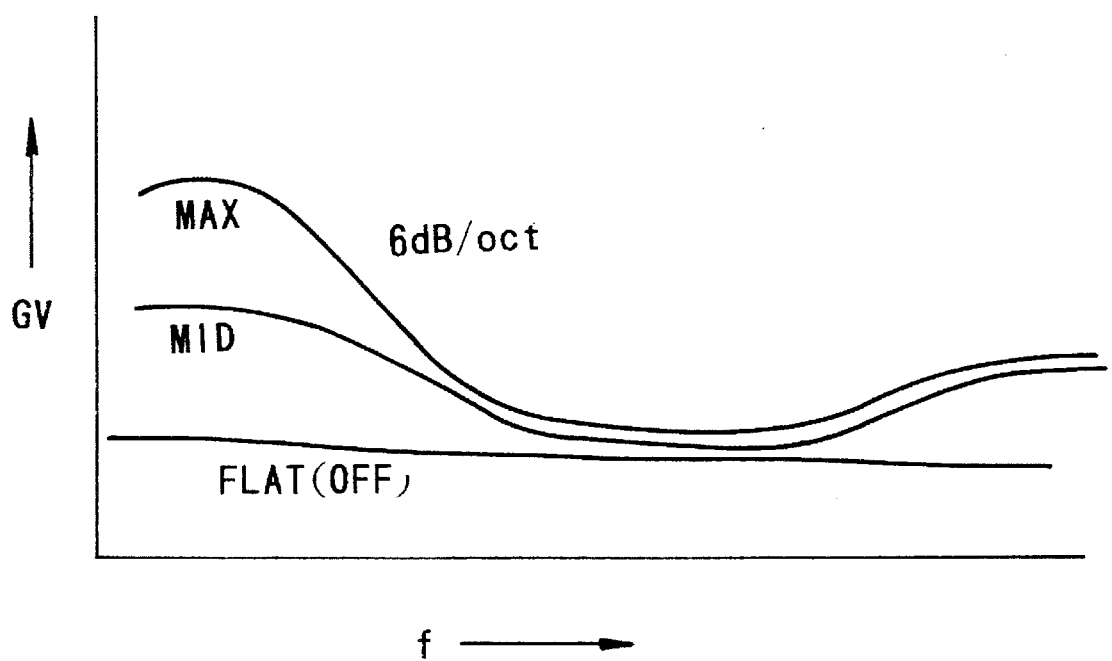
FIG. 2 is a graph showing the signal amplification characteristics of the circuit shown in FIG. 1.

FIG. 2 is a graph showing the characteristic curves of signal amplification by the output circuit 10a. The vertical axis of the graph plots voltage gain GV and the horizontal axis plots frequency f.

The curve indicated by MAX shows the characteristic that is set when terminal 2a is connected to the (−) input of output amplifier 11 via switch circuit 2 as shown in FIG. 1. This is the case where the second portion 1b of the negative feedback circuit 1 is selected such that switch circuit 2 is connected to terminal 2b (for performing emphasis on the low- and high-band frequencies), which in turn is connected to terminal 2d while, at the same time, the switch 6 is off. In this case, the amount of low-band negative feedback is substantially reduced by electrolytic capacitor Cb and resistor Rd and this is also true for the amount of high-band negative feedback, which is reduced by capacitors Cc and Ca.

If switch 6 is turned on, both the high- and low-band frequencies undergo damping by parallel inserted resistor Rc and the characteristic of amplification changes to a MID state.

If switch circuit 2 is connected to terminal 2c rather than terminal 2b, terminal 2c in turn is connected to terminal 2d (for not performing emphasis on the low- or high-band frequency), whereby the first portion 1a of the negative feedback circuit 1 is selected. In this case, a flat characteristic is provided as designated by FLAT in FIG. 2. One will note that on the high-band side, the MAX and MID characteristic curves slope slightly upward and thereafter become level; this is the effect of inserting damping resistor Re in series with capacitor Cc.

The circuit according to the embodiment described above is so configured as to perform emphasis on the low- and high-band frequencies; however, it is also within the scope of the invention to perform emphasis of only the low-band frequency. The amplifiers in the output circuit 10a are all operational amplifiers but this is not the sole case of the invention and other kinds of amplifiers may be employed.

In the embodiment, switch circuits are provided such that the terminal for receiving a feedback signal having a filter characteristic or the terminal for receiving a feedback signal having a flat characteristic is selectively applied to the (−) input of each operational amplifier. If desired, the switch circuits may be of a two-terminal type that connects the terminal for receiving a feedback signal having a filter characteristic to the (−) input.

What is claimed is:

1. A low-voltage driven, audio signal amplifying apparatus which comprises:

output stage amplifiers for receiving the respective outputs of preamplifiers provided in correspondence to the left and right channels in a stereo system;

negative feedback circuits connected respectively to respective outputs of the output stage amplifiers for reducing the amount of low-band negative feedback; and switch circuits which are turned on to supply respective feedback signals from the respective feedback circuits to respective negative feedback inputs of said output stage amplifiers; wherein said switch circuits are turned on simultaneously, thereby allowing said output stage amplifiers to perform emphasis on the low-band frequency.

2. A low-voltage driven, audio signal amplifying apparatus according to claim 1, wherein said output stage amplifiers are supplied with power from a battery and said switch circuits are simultaneously controlled to be turned on or off by means of a control circuit.

3. A low-voltage driven, audio signal amplifying apparatus according to claim 2, wherein each of said output stage amplifiers is composed of an operational amplifier, each of said switch circuits is inserted between the (−) input terminal of said operational amplifier and the terminal of said negative feedback circuit which generates a feedback signal, and said control circuit generates a signal for controlling said switch circuits to be turned on or off in response to a selected position of an externally manipulated switch.

4. A low-voltage driven, audio signal amplifying apparatus according to claim 3, wherein each of said negative feedback circuits comprises a first negative feedback circuit portion connected in parallel to a second negative feedback circuit portion having a flat frequency characteristic, and each of said switch circuits is a selector circuit that selectively supplies the (−) input terminal of the associated operational amplifier with either a negative feedback signal from said first negative feedback circuit portion or a negative feedback signal from said second negative feedback circuit portion.

5. A low-voltage driven, audio signal amplifying apparatus according to claim 4, wherein said first negative feedback circuit portion comprises a first filter circuit which increases the amount of feedback of the medium- to high-band frequencies compared to the low-band frequency, a damping resistor connected in parallel to said filter circuit via a switch circuit, and a second filter circuit for reducing the amount of feedback of the high-band frequency, and wherein said damping resistor is connected if said switch circuit is turned on by means of said control circuit.

6. A low-voltage driven, audio signal amplifying apparatus according to claim 1, which further includes a voltage-follower center amplifier for generating a reference voltage, the output of said center amplifier being connected to the outputs of said output stage amplifiers via speakers.

7. A portable acoustic apparatus comprising:

output stage amplifiers for receiving the respective outputs of preamplifiers provided in correspondence to the left and right channels in a stereo system;

negative feedback circuits connected respectively to respective outputs of the output stage amplifiers for reducing the amount of low-band negative feedback; and switch circuits which are turned on to supply respective feedback signals to respective negative feedback inputs of said output stage amplifiers; and speakers provided in correspondence to the left and right channels for receiving the respective outputs from said output stage amplifiers; wherein said switch circuits are turned on simultaneously, thereby allowing said output stage amplifiers to perform emphasis on the low-band frequency.

8. A portable acoustic apparatus according to claim 7, wherein said output stage amplifiers are supplied with power from a battery and said switch circuits are simultaneously controlled to be turned on or off by means of a control circuit.

* * * * *